US010615191B2

(12) United States Patent
Reit et al.

(10) Patent No.: US 10,615,191 B2
(45) Date of Patent: Apr. 7, 2020

(54) POLYMER SUBSTRATE FOR FLEXIBLE ELECTRONICS MICROFABRICATION AND METHODS OF USE

(71) Applicant: ARES Materials, Inc., Dallas, TX (US)

(72) Inventors: Radu Reit, Carrollton, TX (US); Adrian Avendano-Bolivar, Plano, TX (US); David Arreaga-Salas, Garland, TX (US)

(73) Assignee: ARES MATERIALS INC., Dallas, TX (US)

( * ) Notice: Subject to any disclaimer, the term of this patent is extended or adjusted under 35 U.S.C. 154(b) by 304 days.

(21) Appl. No.: 15/494,000

(22) Filed: Apr. 21, 2017

(65) Prior Publication Data

US 2017/0338254 A1 Nov. 23, 2017

Related U.S. Application Data

(60) Provisional application No. 62/339,410, filed on May 20, 2016, provisional application No. 62/339,418, filed on May 20, 2016, provisional application No. 62/413,330, filed on Oct. 26, 2016.

(51) Int. Cl.
*H01L 27/12* (2006.01)
*B05D 1/00* (2006.01)
(Continued)

(52) U.S. Cl.
CPC ......... *H01L 27/1266* (2013.01); *B05D 1/005* (2013.01); *B05D 1/28* (2013.01); *B05D 3/007* (2013.01); *H01L 27/1218* (2013.01); *H01L 27/1225* (2013.01); *H01L 29/7869* (2013.01); *H01L 29/78603* (2013.01); *H05K 1/189* (2013.01); *H01L 27/3262* (2013.01);
(Continued)

(58) Field of Classification Search
USPC ......................................... 156/247, 249, 289
See application file for complete search history.

(56) References Cited

U.S. PATENT DOCUMENTS 5,976,422 A * 11/1999 Okoroafor ............... G02B 5/23
                                                                252/183.11
8,884,433 B2    11/2014 Lin et al.
(Continued)

FOREIGN PATENT DOCUMENTS

JP      2015202674 A    11/2015
WO      2015170096 A1   11/2015
WO      2017034858 A1   3/2017

OTHER PUBLICATIONS

T. Ware, et al.; "Thiol-ene/acrylate substrates for softening intracortical electrodes"; Journal of Biomaterials Research Part B; May 13, 2013; abstract pp. 2-6, 8, 10; vol. 102 B.
(Continued)

*Primary Examiner* — Sing P Chan
(74) *Attorney, Agent, or Firm* — McGuireWoods LLP

(57) ABSTRACT

Provided are flexible electronics stacks and methods of use. An example flexible electronics stack includes a flexible polymeric substrate film and a rigid inorganic electronic component. The flexible polymeric substrate film includes a thermoset polymer prepared by curing a monomer solution; wherein the monomer solution comprises about 25 wt % to about 65 wt % of one or more thiol monomers and from about 25 wt % to about 65 wt % of one or more co-monomers.

13 Claims, 8 Drawing Sheets

(51) Int. Cl.
    *B05D 1/28*     (2006.01)
    *B05D 3/00*     (2006.01)
    *H01L 29/786*     (2006.01)
    *H05K 1/18*     (2006.01)
    *H01L 27/32*     (2006.01)
    *H01L 51/00*     (2006.01)
    *H05K 1/03*     (2006.01)

(52) U.S. Cl.
    CPC .... *H01L 51/0097* (2013.01); *H01L 2227/326* (2013.01); *H01L 2251/5338* (2013.01); *H05K 1/0393* (2013.01); *H05K 2201/0108* (2013.01)

(56) References Cited

U.S. PATENT DOCUMENTS

| 2003/0017679 | A1 | 1/2003 | Lee et al. |
| 2010/0279125 | A1 | 11/2010 | Buyuktanir et al. |
| 2014/0073755 | A1 | 5/2014 | Seferos et al. |
| 2015/0018659 | A1 | 1/2015 | Ware et al. |
| 2016/0167299 | A1* | 6/2016 | Jallouli ............ B29D 11/00432 351/159.73 |

OTHER PUBLICATIONS

H. Peng, et al.; "Facile Image Patterning via Sequential Thiol-Michael/Thiol-yne Click Reaction"; Chemistry of Materials, Nov. 10, 2014; pp. 6819-6826, 6821-6822; vol. 26.

S. Blackburn; "Synthesis of High refractive Index Silicone Materials Incorporating Aromatic Moieties with Adjacent Linkage Groups for Flexible Electronic Displays"; Silicon; Apr. 28, 2016; title, p. 1.

International Search Report and Written Opinion for corresponding International Patent Application No. PCT/US2017/028879; dated Jul. 6, 2017.

Pawin, Solanki, et al., "A Quantitative Approach to Hydrogen Bonding at a Metal Surface", Journal of the American Chemical Society, 2007, 112056-12057, 29 (40).

* cited by examiner

POLYMER SUBSTRATE FOR FLEXIBLE ELECTRONICS MICROFABRICATION AND METHODS OF USE

BACKGROUND

Substrate material choice for microfabrication is a factor used in the design of flexible electronics. Flexible displays are a type of flexible electronics. One of the core components in these devices is the display's backplane, which provides a matrix of addressable thin-film transistor (hereafter "TFT") devices to control the display's pixels. The use of oxide-based semiconductors is becoming increasingly popular for large-area TFT fabrication. This is due to indium gallium zinc oxide (hereafter "IGZO") TFTs' favorable electrical characteristics, and the ease of converting existing amorphous silicon manufacturing lines for compatibility with IGZO device fabrication. A limitation seen today in the microfabrication of low-cost and high-yield flexible backplane TFT stacks is the flexible substrate material.

The fabrication of this substrate material is a critical step in order to enable these devices. Slot-die coating is a scalable manufacturing technique used to deposit thin-films of liquid material with a high degree of uniformity. In the case of polymer formulations (as used in photoresist, high-performance coatings, or substrates for microfabrication applications), slot-die coating may provide a low-cost method for the fabrication of large-area thin-films. For high-performance organic films, the typical polymer formulation that allows slot-die coating includes a significant liquid fraction (i.e. the solvent) and a low solid fraction (i.e. the solute). However, this method may lead to non-uniformity of the substrate surface due to the evaporation required for the solid fraction to precipitate and form a continuous film.

Current slot-die coatings for flexible electronics employ the use of solvated substrate materials (e.g., polyamic acid solutions), solvated organic photovoltaic materials (e.g., polyfluorenes, polythiophenes), or solvated organic semiconductors (e.g., polycyclic aromatic hydrocarbons) where a majority of the coating may be evaporated away. However, in these applications a substantial fraction may remain in the solid film after curing and this may cause off-gassing during sensitive processing applications such as high-vacuum deposition or thermal annealing.

Other challenges in flexible display backplane manufacturing may be due at least in part to the photolithographic processes that the substrate of the backplane must withstand. Even at temperatures below second-order transition and phase-change temperatures, existing backplane substrates do not allow for reliable and reproducible alignment over subsequent photolithographic steps requiring thermal cycling or cycling of other environmental stimuli. In addition, creep, fatigue, and micro-to-macro-scale network rearrangement cause problems for existing backplane substrates and render them inadequate at higher temperatures, such as those often required for formation of additional backplane structures on the substrate or further electronics structures on the backplane.

Once the thin film devices are fabricated on the flexible substrate, they must be integrated for optimal performance and feasibility using a hybrid approach. Full device construction is necessary wherein the flexible materials (organic substrates, thin-film electronics, etc.) are interfaced with rigid components (traditional surface-mount components, integrated circuits, etc.). However, this interface is typically poor due to the lack of covalent or metallic bonding between the flexible and rigid components. Additionally, mismatches in the physical properties of the materials such as the coefficient of thermal expansion (hereafter "CTE") can lead to interfacial stresses which when coupled with a poor adhesion at the flexible-rigid interface, lead to delamination of the devices from the substrate and ultimately device failure. Current methodologies for interfacing these materials involve the careful management of interfacial stresses (e.g., the design and use of low-CTE materials, the engineering of strain tolerant interfacial structures, etc.) or the use of through-substrate vias for interconnects between the organic and inorganic components.

The roughness of the flexible polymer substrate is another important factor for consideration in the preparation of a substrate suitable for the microfabrication thin-film structures. Most polymer processing techniques yield substrates with unsuitable surface roughness ($R_a$>5 nm) due to either technique-induced roughness (e.g. molding, extruding, etc.) or the nature of the polymer backbone behavior (e.g. semi-crystalline, liquid crystalline, etc.) However, by utilizing monomeric or oligomeric precursor solutions, a film may be deposited via a plurality of methods (e.g. die coating, blade coating, dip coating, etc.) that produce continuous films with low surface roughness ($R_a$<5 nm) and cure the materials in this final, smooth-surface state.

An additional benefit to utilizing materials without semi-crystalline, liquid crystalline, or other backbones with other elevated degrees of secondary interactions is that the amorphous nature of these polymers leads to substrates with a high degree of optical transparency and minimal optical anisotropy (e.g., refractive index anisotropy, through-thickness retardation, etc.) Such materials have desirable applications in devices that utilize electromagnetic waves in the visible spectrum (visible light) as either an input or output, and minimize the optical loss as well as the power required to power such devices.

Current flexible electronics backplane materials, such as biaxially-oriented polyethylene naphthalate, polycarbonate, and polyimides, suffer from the inability to align multiple masks over thermal cycling, which may limit processing temperatures, size, and/or complexity of electronic structures.

BRIEF SUMMARY

Embodiments comprise the use of a high solute-fraction (>50% w/v) coating solution and wherein greater than 50% of the solute in the coating solution is fully incorporated into a polymer network after the slot-die coating deposition. Through selection of mutually-miscible monomers and low melting-temperature materials, a low-(<100 cp), intermediate-(<10,000 cp) or high-viscosity resin (<100,000 cp) may be provided. The resin may be coated atop a carrier substrate (e.g., a glass panel, a silicon wafer, etc.) and cured (e.g., by thermal radiation, electromagnetic radiation, etc.) to provide a final product which may optionally not use further processing to remove small-molecule organics (e.g., organic solvents). Due to the lack of a significant solvent-fraction, the roughness of the final film may be lower than other films deposited from an initial solution with a high solvent-fraction (>50%). This average surface roughness may be quantified (e.g., using methods such as atomic force microscopy, profilometry, or scanning laser microscopy) and should be less than 5 nm on average.

In embodiments, the use of a subset of chemistries known as the thiol-'click' reactions may be used to create substrates that enable semi-covalent linkages to interfacial adhesion layers. Through the careful tuning of the stoichiometry of the underlying substrate, a multitude of reactive moieties can be intentionally presented on the surface of a mechanically-compliant organic substrate in order to promote interlayer adhesion between a thiol-click substrate and an interfacial layer such as, but not limited to, a metallization layer (e.g., iron, molybdenum, gold, etc.), a metal oxide layer (e.g., iron oxide, copper oxide, etc.), or a chalcogenide layer (e.g., tungsten disulfide, lead telluride, etc.). Finally, this layer may be used for interfacing to various other rigid electronic components that may offer better performance, size, cost, or availability.

Traditional binding between flexible organic layers and interfacial layers built from inorganic materials relies on Van der Waals forces present during the interactions of molecular dipoles at the interface or hydrogen bonding between the various electronegativity elements composing the respective organic or inorganic layer. In the case of the off-stoichiometry thiol-click networks, a partially covalent linkage can be formed between the organic phase which presents an excess of functional groups (thiols, alkenes, epoxides, etc.) and a variety of metals, metal oxides or chalcogenides used as a primer for the attachment of inorganic components through industry-standard methodologies, including but not limited to reflow soldering, ultrasonic welding, thermosonic bonding, wire bonding, ball bonding, wedge bonding, flip chip bonding, isotropic conductive adhesion and anisotropic conductive adhesion.

The example embodiments provide a backplane polymer substrate, as well as methods for fabricating and possible uses for the same. A substrate of one or more exemplary embodiments can be used for applications including: thin, light weight display, a flexible display, sensors, biomedical devices and photovoltaics.

BRIEF DESCRIPTION OF THE DRAWINGS

Illustrative examples of the present disclosure are described in detail below with reference to the attached drawing figures, which are incorporated by reference herein, and wherein.

The illustrated figures are exemplary only and are not intended to assert or imply any limitation with regard to the environment, architecture, design, or process in which different examples may be implemented.

DETAILED DESCRIPTION

The present disclosure relates to the fabrication of electronics on a flexible polymeric substrate. The flexible polymeric substrate may be an electronic-grade polysulfide film suitable for microfabrication. The flexible polymeric substrates may undergo a thermomechanical transition (e.g., a glass transition and/or melt transition) during thermal cycling of photolithographic processing. In doing so, the use of the flexible polymeric substrates may allow for the management of thermal stress caused by any dissimilarities in thermal expansion, and permit the fabrication of circuitry atop the flexible polymeric substrates. Additional benefits of of the flexible polymeric substrates are extremely smooth surfaces, easily-tunable optical properties such as transmission and birefringence, increased adhesion between thin-films deposited atop the substrate, and chemical compatibility with a host of acids, bases and solvents.

Figure 1:
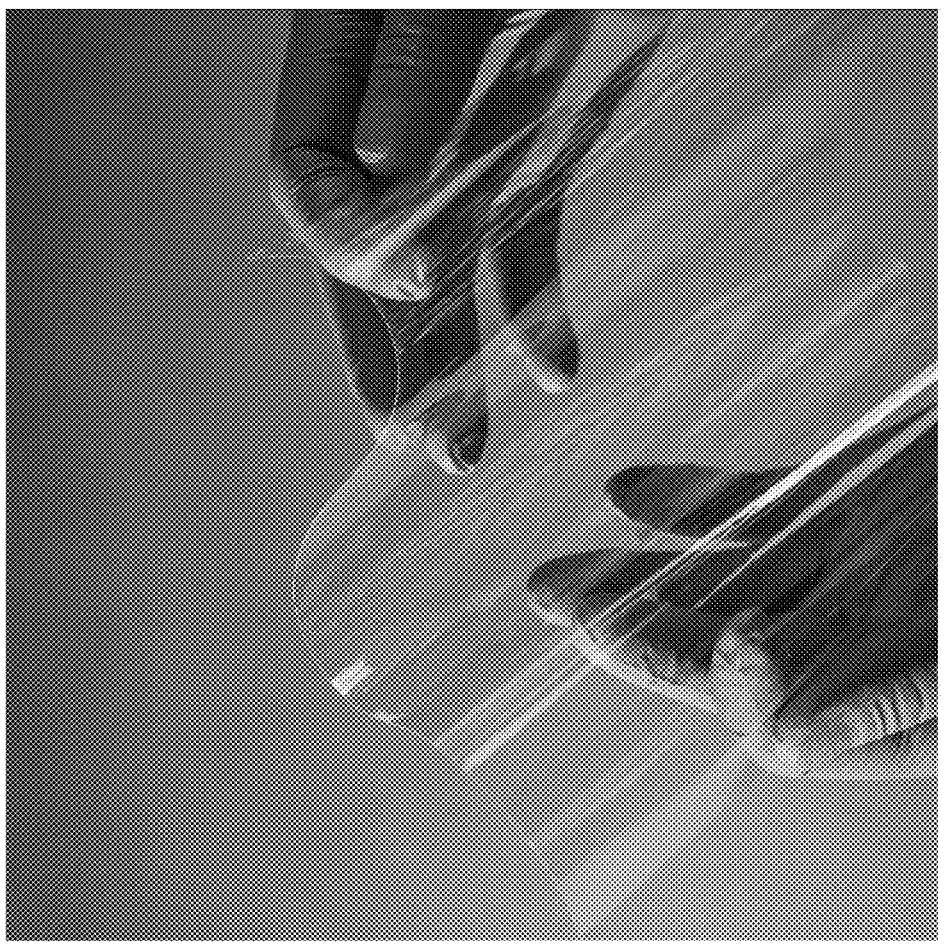
FIG. 1 is an example of a transparent flexible substrate.
Figure 2:
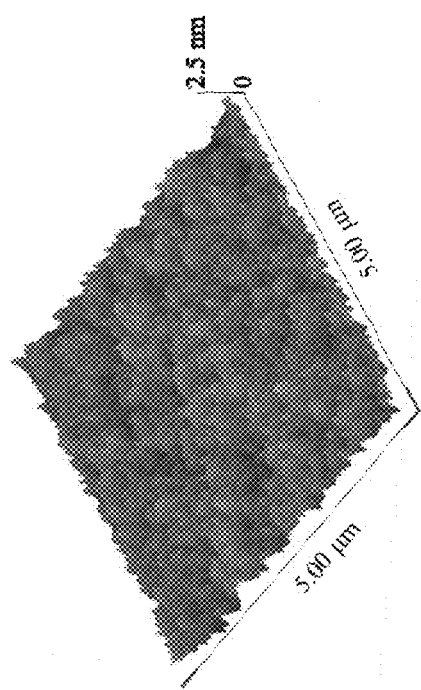
FIG. 2 is an illustration of a surface morphology of the transparent flexible substrate of FIG. 1.

The flexible polymeric substrate is a transparent flexible polymer substrate engineered for use in the fabrication of high-performance electronic devices. FIG. 1 illustrates an examples flexible polymeric substrate. The material is highly resistant to the wet chemistries used in standard photolithography processes, and the flexible substrate material's dimensional stability allows for its use with stepper aligners for precise photopatterning of component features. The flexible polymeric substrate has an inherent surface roughness of less than 0.5 nm, making it receptive to microfabrication such as thin film transistor manufacturing. FIG. 2 illustrates a surface topology of the flexible polymeric substrate, as cast on a silicon carrier. A flexible substrate material solution may be cast using a slot die coating system atop a clean carrier substrate.

For preparing slot-die coated films of the flexible polymeric substrate, and more particularly to the use of high (>50%) solute-fraction mixtures for preparing the slot-die coated films of the flexible polymeric substrate, as used herein, a "solvent" is defined as a component that will not be covalently bonded into the produced flexible polymeric substrate and a "solute" is defined as a component of the slot-die coating mixture that may become covalently bonded into the polymeric network which makes up the produced flexible polymeric substrate film. The solute portion thus comprises the monomers or mixture of monomers necessary to produce the flexible polymeric substrate. While the monomers or the mixture of monomers may be a liquid for coating, after a curing process (involving thermal or electromagnetic radiation) they may cure such that greater than 50% of the solute-fraction (i.e., the monomers or mixture of monomers) have been covalently-incorporated into the flexible polymeric substrate film. After the slot-die coating mixture is deposited via the slot-die coating mechanism, the lack of a high solvent fraction (>50%) allows for less of the evaporative effects (e.g., glassy crust formation, thermal and convective instabilities, etc.) that may lead to increased surface roughness atop the deposited film. This may allow for flexible polymeric substrate films with low surface roughness (e.g., less than 5 nm average roughness). In some embodiments, the prepared flexible polymeric substrate films may not use additional processing steps to remove the solvent-fraction before the preparation of electronic structures atop the flexible polymeric substrate.

In some embodiments, the slot-die coating mixture may comprise greater than 50% solute-fraction. In further embodiments, this solute-fraction may be greater than 75%, 85%, 90%, or even 95% of the total slot-die coating mixture. In other embodiments, the solute-fraction of the slot-die coating mixture may comprise a monomer mixture of multifunctional (i.e. greater than 2) thiol monomers and multifunctional comonomers. In other embodiments, the slot-die coating mixture may contain no solvent-fraction and the solute fraction may be solvent-free.

Examples of the multifunctional thiol monomers may include, but are not limited to, trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl]isocyanurate; 3,4-ethylenedioxythiophene; 1,10-decanedithiol; tricyclo[5.2.1.02,6]decanedithiol; benzene-1,2-dithiol; trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri (3-mercapto-propionate); Ethoxylated Trimethylpropantri (3-mercapto-propionate); Polycaprolactone tetra 3-mercaptopropionate; Di-Pentaerythritolhexakis (3-mercaptopropionate); Di-Trimethylolpropanetetra (3-mercaptopropionate); Glycoldi (3-mercaptopropionate); Pentaerythritoltetramercaptoacetate; Trimethylol-propan-etri-mercaptoacetate; Glycoldi-mercaptoacetate; or a combination thereof.

Examples of the multifunctional comonomers may include, but are not limited to, 1,3,5-triallyl-1,3,5-triazine-2,4,6 (1H,3H,5H)-trione; tricyclo[5.2.1.02,6]decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly(ethylene glycol) diacrylate; tricyclodecane dimethanol diacrylate; bisphenol A ethoxylate diarylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; neopentyl glycol diglycidyl ether; tris(2,3-epoxypropyl) isocyanurate; trimethylolpropane triglycidyl ether; 1,1'-(methylenedi-4,1-phenylene)bismaleimide; 1,6-di(maleimido)hexane; 1,4-di(maleimido)butane; N,N'-(1,3-phenylene)dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; or a combination thereof.

Figure 3:
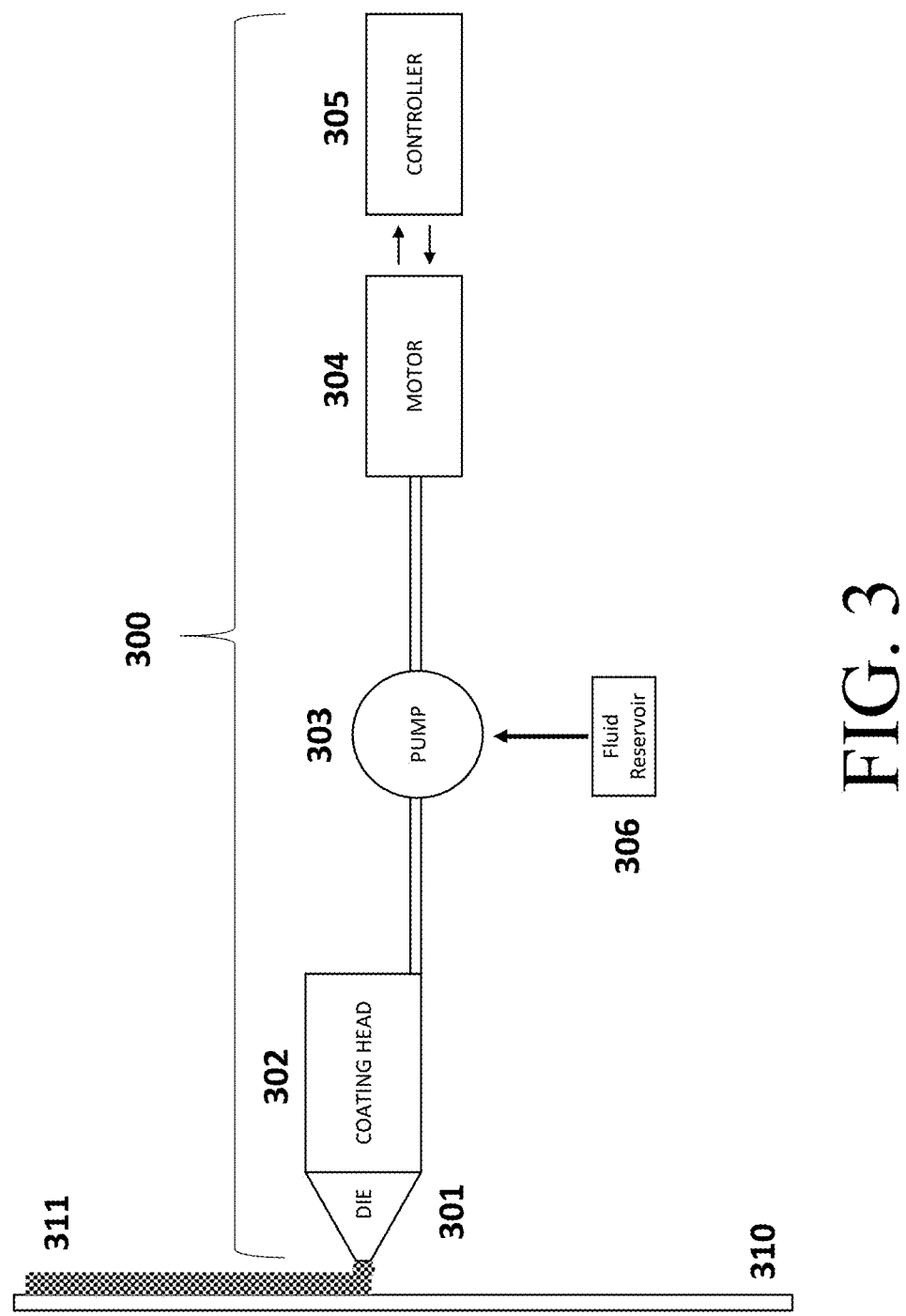
FIG. 3 illustrates an example schematic of a slot-die coating head with a fluid reservoir containing a monomer mixture in accordance with the embodiments described herein.

FIG. 3 illustrates a typical slot-die coating mechanism with a carrier 310 upon which a slot-die coating mixture 311 may be deposited. The slot-die coating mixture 311 may form the flexible polymeric substrates described herein after curing. The slot-die coating mixture 311 is extruded through a die 301 via the coating head 302, which may be controlled by a mechanical pump 303 via a motor 304 with an analog or digital controller 305. A fluid reservoir 306 may be connected to the pump 303 to feed in the slot-die coating mixture 311 to the coating head 302.

Figure 4:
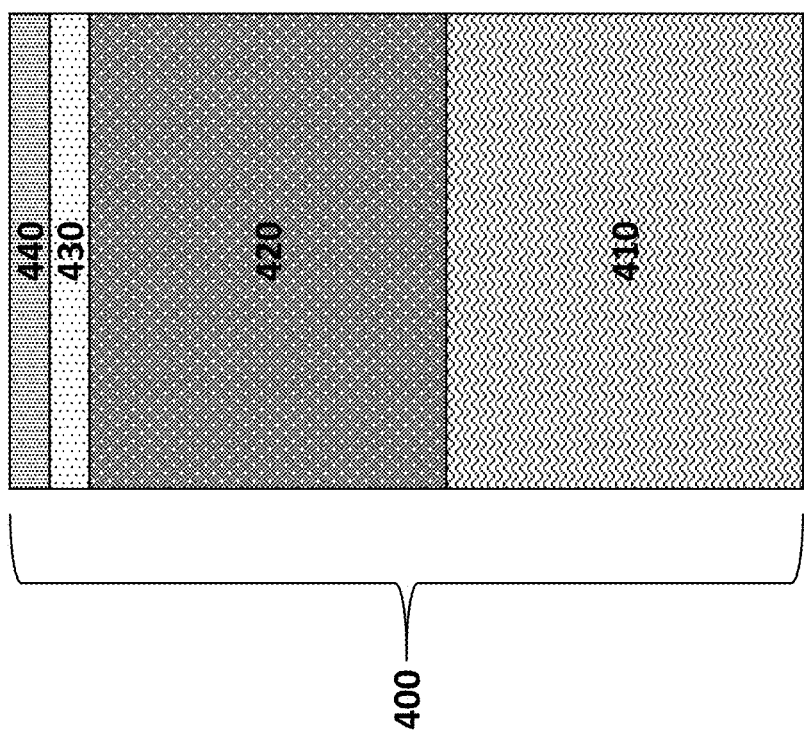
FIG. 4 illustrates a fluid reservoir containing multiple solutes and solvents in accordance with the embodiments described herein.

FIG. 4 illustrates the contents of an example monomer solution 400 that may be used as the slot-die coating mixture 311 in fluid reservoir 306 as illustrated in FIG. 3 and the various components that the monomer solution 400 may comprise. In this example, the solute fraction of the monomer solution 400 comprises solutes 410 and 420 which are monomers and may be covalently bonded in the polymeric network of a produced flexible polymeric substrate film. Solute 410 and solute 420 may be mixed with solvent 430 and solvent 440 to form monomer solution 400. As described herein, the solvent components, 430 and 440, may make up less than 50% by weight of the monomer solution 400. In this specific example, solute 410 comprises 45% by weight of monomer solution 400, solute 420 comprises 45% by weight of the monomer solution 400, solvent 430 comprises 5% by weight of the monomer solution 400, and solvent 440 comprises 5% by weight of the monomer solution 400. While this figure depicts a four-monomer solution 400, any number of solutes may be mixed together and considered the entirety of the solute-fraction. For example, the solute-fraction may comprise 3, 4, 5, 6, and more species of solutes. Moreover, any number of solvents may be mixed together and considered the entirety of the solvent-fraction. For example, the solvent-fraction may comprise 3, 4, 5, 6, and more species of solvents. In examples, the weight percentage of the solvent-fraction may be less than the weight percentage of the solute-fraction.

Embodiments comprise a flexible polymeric substrate film formed from a monomer solution and deposited via slot die coating. In some embodiments, the flexible polymeric substrate film comprises an average surface roughness of less than 5 nm. In some embodiments, the monomer solution comprises a solutes content greater than 50%. In some embodiments, the monomer solution comprises a solutes content greater than 75%. In some embodiments, the monomer solution comprises a solutes content greater than 85%. In some embodiments, the monomer solution comprises a solutes content greater than 90%. In some embodiments, the monomer solution comprises a solutes content greater than 95%. In some embodiments, the monomer solution comprises a multifunctional thiol monomer and a multifunctional comonomer. In some embodiments, the multifunctional thiol monomers may comprise at least one of the following: trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo[5.2.1.02,6]decanedithiol; Benzene-1,2-dithiol; trithiocyanuric acid; dipentaerythritolhexakis(3-mercaptopropionate); 2,3-Di((2-mercaptoethyl)thio)-1-propanethiol; Dimercaptodiethylsulfide; Ethoxylated Trimethylpropan-tri (3-mercapto-propionate); Ethoxylated Trimethylpropantri (3-mercapto-propionate); Polycaprolactone tetra 3-mercaptopropionate; Di-Pentaerythritolhexakis (3-mercaptopropionate); Di-Trimethylolpropanetetra(3-mercaptopropionate); Glycoldi (3-mercaptopropionate); Pentaerythritoltetramercaptoacetate; Trimethylol-propan-etri-mercaptoacetate; Glycoldi-mercaptoacetate; or a combination thereof. In some embodiments, the multifunctional comonomers may comprise at least one of the following: 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly (ethylene glycol) diacrylate; tricyclodecane dimethanol diacrylate; bisphenol A ethoxylate diarylate; tris[2-(acryloyloxy ethyl)] isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; neopentyl glycol diglycidyl ether; tris(2,3-epoxypropyl) isocyanurate; trimethylolpropane triglycidyl ether; 1,1'-(methylenedi-4,1-phenylene)bismaleimide; 1,6-di(maleimido) hexane; 1,4-di(maleimido)butane; N,N'-(1,3-phenylene) dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; or a combination thereof.

In some embodiments, the monomer solution comprises from about 0.001% by weight to about 10% by weight of various small molecule additives.

In some embodiments the small molecule additives are anionic polymerization catalysts and may include, but are not limited to, a secondary amine (e.g.; diisopropylamine), a tertiary amine (e.g., tripropylamine), or a combination thereof. These are provided by way of example and should not be construed as limiting.

In some embodiments the small molecule additives are free-radical initiators and may include, but are not limited to, an acetophenone (e.g., 2,2-dimethoxy-2-phenylacetophenone); a benzyl compound; a benzoin compound (e.g., benzoin methyl ether); a benzophenone (e.g., diphenyl ketone); a quinone (e.g., camphorquinone); a thioxanthone (e.g., 10-methylphenothiazine); azobisisobutyronitrile; a peroxide (e.g. benzoyl peroxide); or a combination thereof.

In some embodiments the small molecule additives are an antioxidant and may include, but are not limited to, a primary antioxidant (e.g. 2-methoxyhydroquinone); a secondary antioxidant (e.g. tris-nonylphenyl phosphite); or a combination thereof.

In some embodiments small molecule additive solvents may be used to dissolve the small molecule additives. The small molecule additive solvents may include, but are not limited to, a polar, protic solvent (e.g., water, methanol); a polar, aprotic solvent (e.g., tetrahydrofuran, dimethyl sulfoxide); a nonpolar solvent (e.g. toluene, chloroform); or any combination thereof.

In embodiments, the flexible polymeric substrate film is prepared by polymerization of a monomer solution (e.g., monomer solution 400 as illustrated in FIG. 4) using the thiol-click reaction mechanism, consisting of at least one thiol monomer and at least one other comonomer. A thiol-click reaction can proceed via a radical step-growth mechanism, wherein free radical sources abstract a hydrogen from the thiol group, leaving a thiyl radical. The thiyl radical can then further react with a variety of functional groups, including but not limited to an alkene comonomer, an alkyne comonomer and a norbornene comonomer. Additionally, a thiol-click reaction can proceed via an anionic mediated step-growth mechanism, wherein an alkaline catalyst can deprotonate a thiol group, leaving a thiolate anion. The thiol anion can then further react with a variety of functional groups, including but not limited to an epoxide comonomer, an isocyanate comonomer and an acrylate comonomer. This monomer solution may then be dispensed into the final form via a plurality of fabrication methods, including but not limited to, reactive injection molding, blade coating, slot-die coating, inkjet printing, chemical vapor deposition and physical vapor deposition.

In some embodiments, the monomer solution may comprise from about 25 wt % to about 65 wt % of one or more multifunctional thiol monomers and from about 25 wt % to about 65 wt % of one or more multifunctional comonomers. In a specific embodiment, the monomer solution may include 51.6 weight percent ("wt %") of the multifunctional thiol monomer trimethylolpropane tris(3-mercaptopropionate) copolymerized with an off-stoichiometric 48.4 wt ¾ of the multifunctional alkene co-monomer 1,3,5-Triallyl-1, 3,5-triazine-2,4,6(1H,3H,5H)-trione, leading to a 50% excess in alkene functionality. In a further embodiment, the copolymerization reaction may be initiated with between 0.001 wt % and 10 wt % small molecule addition. In a specific embodiment, the copolymerization reaction may be initiated by the addition of 1.5 wt % of 2,2-dimethoxy-2-phenylacetophenone as an initiator.

In other embodiments, the monomer solution comprises from about 25 wt % to about 65 wt % of one or more multifunctional thiol monomers and from about 25 wt % to about 65 wt % of one or more multifunctional epoxides. In a specific embodiment, a monomer solution can include 41.2 wt % of the multifunctional epoxide monomer Tris(4-hydroxyphenyl)methane triglycidyl ether copolymerized with an off-stoichiometric 58.8 wt % thiol co-monomer Tris[2-(3-mercaptopropionyloxy)ethyl] isocyanurate, leading to a 25% excess in thiol functionality. In a further embodiment, the copolymerization reaction may be catalyzed with between 0.001 wt % and 10 wt % small molecule addition. In a specific embodiment, the copolymerization reaction may be catalyzed by the addition of 1.5 wt % of tripropylamine as a catalyst.

Figure 5:
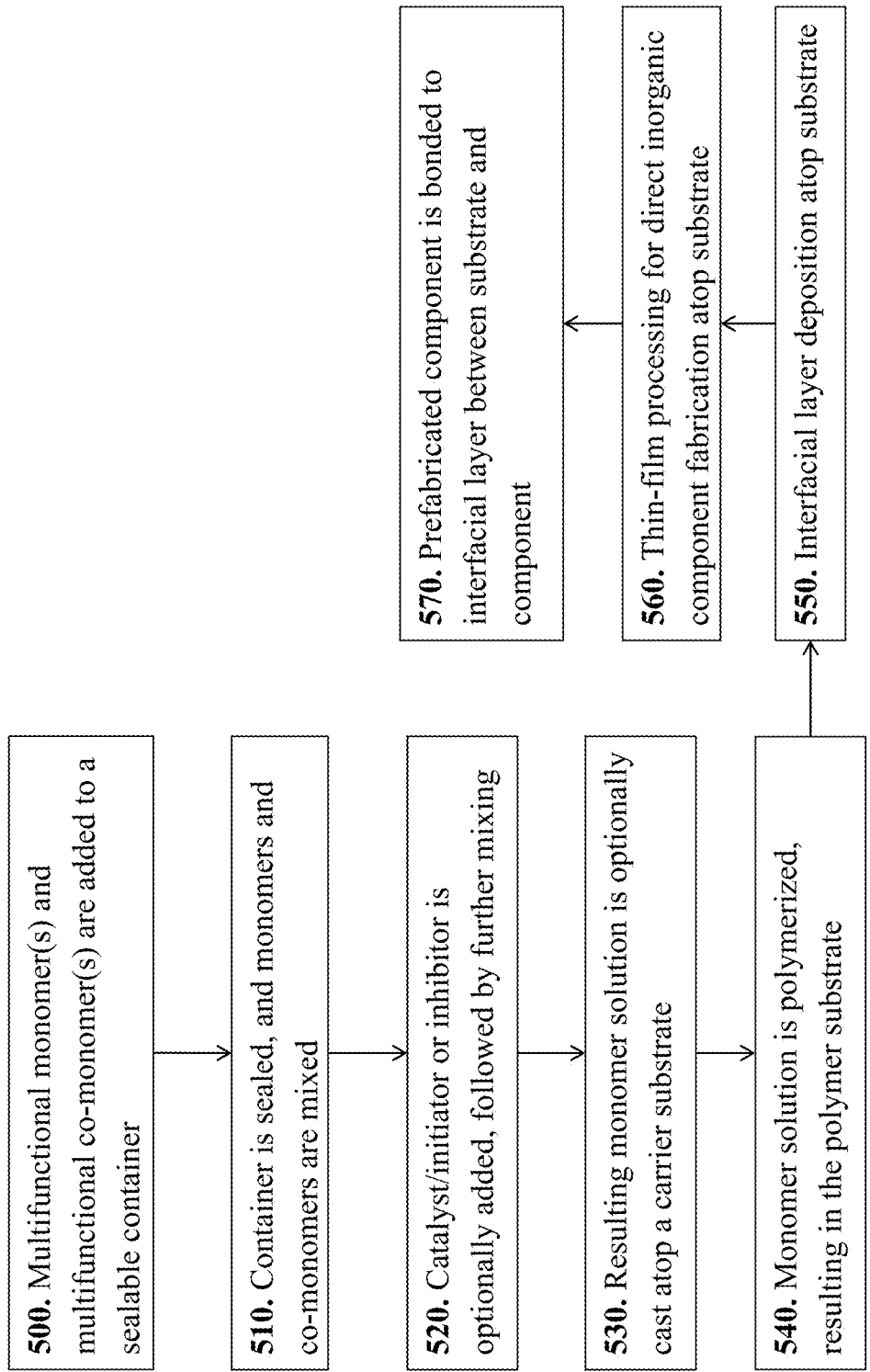
FIG. 5 shows a flow diagram of a method of fabricating a hybrid organic-inorganic electronic stack according to an embodiment.

FIG. 5 demonstrates a typical process flow for the fabrication of the flexible polymeric substrate film, definition of flexible electronic components, and the ultimate mating of the rigid electronic components atop said flexible polymeric substrate film. First, at block 500, a subset of the multifunctional thiol monomers and multifunctional comonomers are added to a sealable container that is closed and mixed 510 via vortexing, rotary mixing, planetary mixing or similar techniques yielding a homogeneous monomer solution. Next, catalysts/initiators or inhibitors are optionally 520 added in compositions requiring faster or slower curing, respectively, and further mixed. The monomer solution is dispensed 530 atop a carrier (e.g. glass, silicon, gallium arsenide, etc.) via manufacturing methods (e.g. blade coating, slot-die coating, etc.) and the monomer solution is polymerized 540 into the flexible polymeric substrate film. This flexible polymeric substrate film atop a carrier may then be used as the flexible polymeric substrate film atop which interfacial adhesion layers are deposited 550 and patterned using thin-film semiconductor processing 560. Finally, a prefabricated rigid electronic component (e.g., a display driver, external battery, etc.) may be mated 570 to the patterned interfacial layer via chip-bonding techniques (e.g., soldering, wirebonding, ultrasonic welding, etc).

The above described chemistries and methodologies may be used for increasing interfacial layer adhesion between the organic and inorganic interfaces in a hybrid electronics stack. A hybrid electronic stack is described for use including, but not limited to, the bonding of rigid electronic components to a flexible electronic stack comprising the flexible polymeric substrate films described herein. Such rigid electronic components include, but are not limited to: an application-specific integrated circuit (ASIC), a system-on-chip (SOC), a central processing unit (CPU), a graphical processing unit (GPU), a microcontroller, a wireless transceiver, a field-programmable gate array (FPGA), a digital signal processor (DSP), an analog-to-digital converter (ADC), a display row or column driver for active matrix backplanes, an amplifier, a non-rechargeable or rechargeable battery, a photosensor, a pressure sensor, a temperature sensor, a surface-mount resistor, capacitor, or inductor, or other non-compliant electronic component.

Monomer combinations may provide the requisite interfacial chemistry for increased layer adhesion between the flexible electronic stack comprising the flexible polymeric substrate films described herein and the rigid electronic components used to produce a hybrid electronic device stack. Through the tuning of the surface chemistries of the flexible polymeric substrate films describe herein, interfacing with metals, metal oxides and chalcogenides may be performed even if mismatched material parameters occur. Mismatched material parameters may include, but are not limited to, mismatched coefficients of thermal expansion (e.g., the CTE of the substrate is between 1.1 and 10 times the CTE of the interfacial layer), mismatched Young's modulus, and mismatched residual film stress. This may be accomplished by the production of flexible polymeric substrate films with the materials and compositions described herein, wherein the resultant flexible polymeric substrate films may allow for an increase in interfacial adhesive strength between a flexible electronic stack comprising the flexible polymeric substrate films described herein and a rigid electronic component.

The principal concept in the increasing of interlayer adhesion between the flexible electronic stack and rigid electronic components is the interaction of various interfacial adhesion layers atop an flexible polymeric substrate film which yields surface functionalities (e.g. thiol, epoxide, alkene, etc.) which are able to participate in further bonding (e.g. hydrogen bonding, semi-covalent bonding, etc.) once the interfacial adhesion layer is directly deposited atop the flexible polymeric substrate film. By presenting reactive groups atop the surface of the flexible polymeric substrate film, further reaction can occur between the flexible polymeric substrate film and the interfacial adhesion layers deposited atop the flexible polymeric substrate film through a variety of methods (e.g. chemical vapor deposition, physical vapor deposition, etc.). In the case of the thiol surface presented moiety, the advantage gained for increased interlayer adhesion is presented due to the higher dissociation energy observed for thiol-metal interfaces versus similar interfaces relying primarily on hydrogen bonding (e.g. plasma treatment of a polyimide surface). This higher dissociation energy between a sulfur and many metals can be considered semi-covalent linkage, leading to the greater interlayer adhesion claimed herein.

Figure 6:
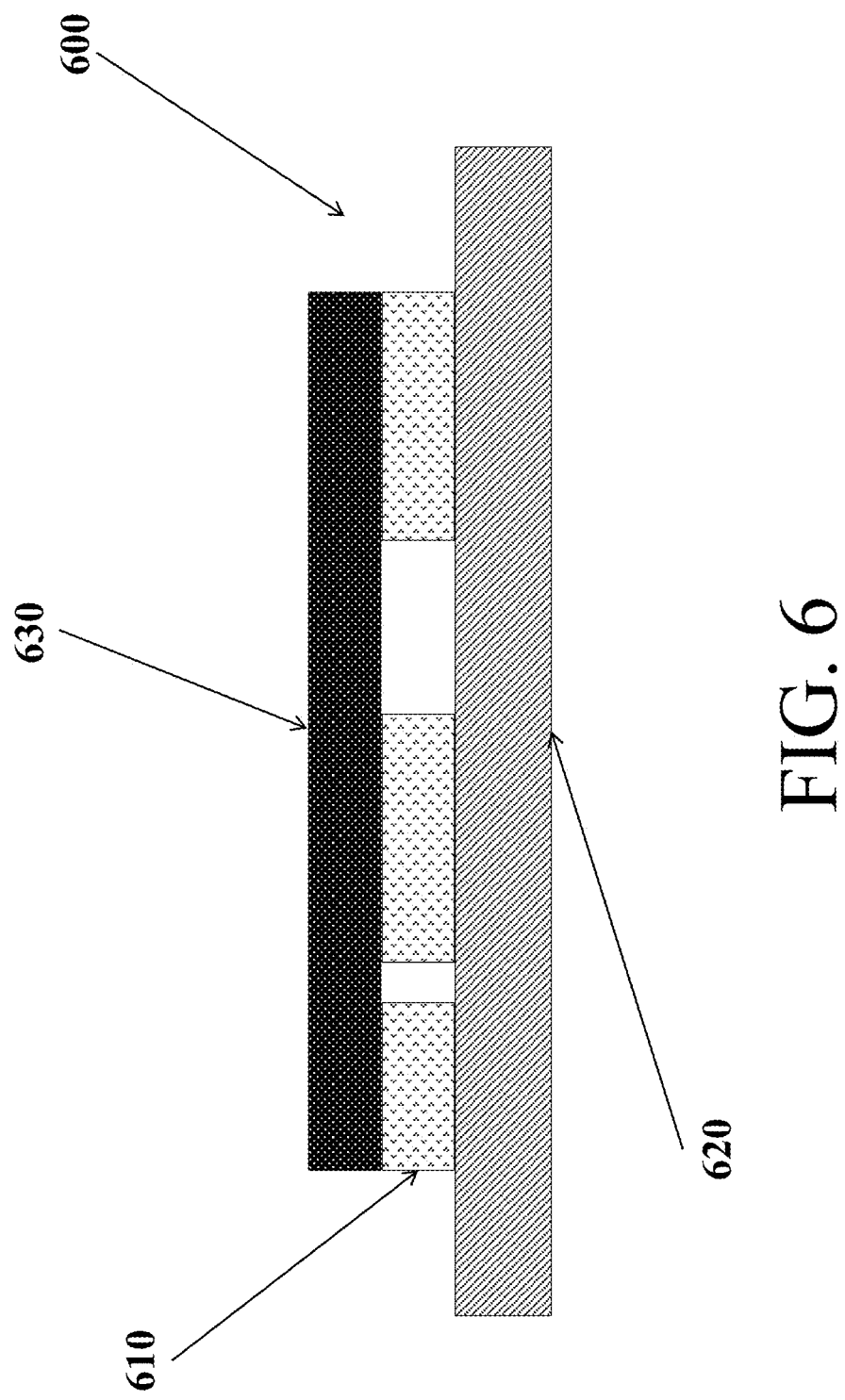
FIG. 6 shows a cross-sectional perspective of a hybrid organic-inorganic electronic stack according to an embodiment.

FIG. 6 illustrates a cross-sectional perspective of a hybrid electronic stack 600. One or more interfacial adhesion layers (e.g., thin-film metals, metal oxides, chalcogenides, etc.) 610 may be deposited directly atop a flexible polymeric substrate film 620 and patterned using subtractive semiconductor processing photolithographic techniques to serve as connection sites for any rigid inorganic components 630. The rigid inorganic components 630 may require mating and may be fabricated as inflexible electronics stacks (e.g. display drivers on thick Si substrates).

In some embodiments, flexible electronic stacks are provided. An example flexible electronics stack may comprise an flexible polymeric substrate film. The flexible polymeric substrate film may comprise a thermoset thiol-click polymer. The thermoset thiol-click polymer may be prepared by curing a monomer mixture. The monomer mixture may comprise from about 25 wt % to about 65 wt % of one or more multifunctional thiol monomers and from about 25 wt % to about 65 wt % of one or more multifunctional co-monomers. The flexible electronics stack may further comprise an interfacial adhesion layer and a rigid electronic component. The monomer mixture may further comprise from about 0.001 wt % to about 10 wt % of small molecule additive. The small molecule additive may comprise an acetophenone; a benzyl compound; a benzoin compound; a benzophenone; a quinone; a thioxanthone; azobisisobutyronitrile; benzoyl peroxide; hydrogen peroxide, or a combination thereof. The multifunctional thiol monomers may comprise trimethylolpropane tris(3-mercaptopropionate); trimethylolpropane tris(2-mercaptoacetate); pentaerythritol tetrakis(2-mercaptoacetate); pentaerythritol tetrakis(3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy) ethyl]isocyanurate; 3,4-ethylenedioxythiophene; 1,10-decanedithiol; tricyclo[5.2.1.02,6]decanedithiol; Benzene-1,2-dithiol; and trithiocyanuric acid; dipentaerythritol hexakis(3-mercaptopropionate); 2,3-Di((2-mercaptoethyl)thio)-1-propanethiol; Dimercaptodiethylsulfide; Ethoxylated Trimethylpropan-tri(3-mercapto-propionate); Ethoxylated Trimethylpropantri(3-mercapto-propionate); Polycaprolactone tetra 3-mercaptopropionate; Di-Pentaerythritolhexakis(3-mercaptopropionate); Di-Trimethylolpropanetetra(3-mercaptopropionate); Glycoldi(3-mercaptopropionate); Pentaerythritoltetramercaptoacetate; Trimethylol-propan-etri-mercaptoacetate; Glycoldi-mercaptoacetate; or a combination thereof. The multifunctional co-monomers may comprise 1,3,5-triallyl-1,3,5-triazine-2,4,6 (1H,3H,5H)-trione; tricyclo[5.2.1.02,6] decanedimethanol diacrylate; divinyl benzene; diallyl bisphenol A (diacetate ether); di allyl terephthalate; di allyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly(ethylene glycol) diacrylate; tricyclodecane dimethanol diacrylate; bisphenol A ethoxylate diarylate; tris[2-(acryloyloxyethyl)]isocyanurate; trimethylolpropane triacrylate; pentaethrytolpropane tetraacrylate; dipentaethrytolpropane penta-/hexa-acrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; neopentyl glycol diglycidyl ether; tris(2,3-epoxypropyl) isocyanurate; trimethylolpropane triglycidyl ether i. 1,1'-(methylenedi-4,1-phenylene)bismaleimide; 1,6-di(maleimido)hexane; 1,4-di(maleimido)butane; N,N'-(1,3-phenylene)dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; or a combination thereof.

The flexible polymeric substrate film may comprise a thermoset polymer. The flexible polymeric substrate film may be capable of being processed at a temperature higher than the glass transition temperature of the thermoset polymer.

In some embodiments of the disclosure, methods of fabricating a flexible electronics stack are provided. An example method comprises preparing a monomer mixture and curing the monomer mixture to form a flexible polymeric substrate film comprising a thermoset thiol-click polymer as a substrate for thin-film processing. The pre-thermoset monomer mixture may comprise from about 25 wt % to about 65 wt % of one or more multifunctional thiol monomers and from about 25 wt % to about 65 wt % of one or more multifunctional co-monomers.

The method may comprise depositing an interfacial adhesion layer atop the flexible polymeric substrate film. The method may further comprise coupling a prefabricated inorganic electronic component to the flexible polymeric substrate film using the interfacial adhesion layer.

The pre-thermoset monomer mixture may further comprise from about 0.001 wt % to about 10 wt % of small molecule additives. The small molecule additive may comprise at least one of the following: an acetophenone; a benzyl compound; a benzoin compound; a benzophenone; a quinone; a thioxanthone; azobisisobutyronitrile; benzoyl peroxide; and hydrogen peroxide. The multifunctional thiol monomers may comprise at least one of the following: trimethylolpropane tris(3-mercaptopropionate); trimethylolpropane tris(2-mercaptoacetate); pentaerythritol tetrakis (2-mercaptoacetate); pentaerythritol tetrakis (3-mercaptopropionate); 2,2'-(ethylenedioxy)diethanethiol; 1,3-Propanedithiol; 1,2-ethanedithiol; 1,4-butanedithiol; tris[2-(3-mercaptopropionyloxy)ethyl] isocyanurate; 3,4-ethylenedioxythiophene; 1,10-decanedithiol; tricyclo [S.2.1.02,6]decanedithiol; Benzene-1,2-dithiol; and trithiocyanuric acid, dipentaerythritol hexakis(3-mercaptopropionate); 2,3-Di((2-mercaptoethyl)thio)-1-prop anethiol; Dimercaptodiethylsulfide; Ethoxylated Trimethylpropan-tri (3-mercapto-propionate); Ethoxylated Trimethylpropantri (3-mercapto-propionate); Polycaprolactone tetra 3-mercaptopropionate; Di-Pentaerythritolhexakis(3-mercaptopropionate); Di-Trimethylolpropanetetra (3-mercaptopropionate); Glycoldi (3-mercaptopropionate); Pentaerythritoltetramercaptoacetate; Trimethylol-propanetri-mercaptoacetate; Glycoldi mercaptoacetate; or a combination thereof. The multifunctional co-monomers may comprise at least one of the following: 1,3,5-triallyl-1,3,5-triazine-2,4,6 (1H,3H,SH)-trione; tricyclo[S.2.1.02,6] decanedimethanol diacrylate; divinyl benzene; diallyl bisphenol A (diacetate ether); diallyl terephthalate; diallyl phthalate; diallyl maleate; trimethylolpropane diallyl ether; ethylene glycol dicyclopentenyl ether acrylate; diallyl carbonate; diallyl urea; 1,6-hexanediol diacrylate; cinnamyl cinnamate; vinyl cinnamate; allyl cinnamate; allyl acrylate; crotyl acrylate; cinnamyl methacrylate; trivinylcyclohexane; 1,4-cyclohexanedimethanol divinyl ether; poly(ethylene glycol) diacrylate; tricyclodecane dimethanol diacrylate; bisphenol A ethoxylate diarylate; tris[2-(acryloyloxy ethyl)] isocyanurate; trimethylolpropane triacrylate; pentaethrytolpropane tetraacrylate; dipentaethrytolpropane penta-/hexaacrylate; poly(ethylene glycol) dimethacrylate; dimethanol dimethacrylate; bisphenol A ethoxylate dimetharylate; trimethylolpropane trimethacrylate; pentaethrytolpropane tetramethacrylate; bisphenol A diglycidyl Ether; neopentyl glycol diglycidyl ether; tris(2,3-epoxypropyl) isocyanurate; trimethylolpropane triglycidyl ether i. 1,1'-(methylenedi-4, 1-phenylene)bismaleimide; 1,6-di(maleimido)hexane; 1,4-di(maleimido)butane; N,N'-(1,3-phenylene)dimaleimide; isophorone diisocyanate; xylylene diisocyanate; tolylene diisocyanate; 1,4-diisocyanatobutane, 1,6-diisocyanatohexane, 1,8-diisocyanatooctane; vinyl norbornene; dicyclopentadiene; ethylidene norbornene; or a combination thereof.

The monomer mixture may be polymerized in a pressurized reservoir. The pre-thermoset monomer mixture may be formed into the final shape using at least one of the following apparatuses: an oven; a slot die coater; a rod coater; a blade coater; a spin coater; and a reaction injection mold. The pre-thermoset monomer mixture may be off-stoichiometrically balanced with at least 5% excess mols of the thiol monomers. The pre-thermoset monomer mixture may be off-stoichiometrically balanced with at least 10% excess mols of the thiol monomers. The pre-thermoset monomer mixture may be off-stoichiometrically balanced with at least 15% excess mols of the thiol monomers. The pre-thermoset monomer mixture may be off-stoichiometrically balanced with at least 20% excess mols of the thiol monomers. The pre-thermoset monomer mixture may be off-stoichiometrically balanced with at least 25% excess mols of the thiol monomers. The pre-thermoset monomer mixture may be off-stoichiometrically balanced with at least 5% excess mols of the comonomers. The pre-thermoset monomer mixture may be off-stoichiometrically balanced with at least 10% excess mols of the comonomers. The pre-thermoset monomer mixture may be off-stoichiometrically balanced with at least 15% excess mols of the comonomers. The pre-thermoset monomer mixture may be off-stoichiometrically balanced with at least 20% excess mols of the comonomers. The pre-thermoset monomer mixture may be off-stoichiometrically balanced with at least 25% excess mols of the comonomers.

The interfacial adhesion layer may be capable of being processed at a temperature higher than the glass transition temperature of the thermoset polymer. The interfacial adhesion layer may be deposited through thermal evaporation such as electron beam evaporation or molecular beam epitaxy, reactive ion sputtering, pulsed laser deposition, atomic layer deposition, chemical vapor deposition, electroplating, or spin coating. The interfacial adhesion layer may comprise a transition metal, including Scandium, Titanium, Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Hafnium, Tantalum, Tungsten, Rhenium, Osmium, Iridium, Platinum, Gold, Mercury, or a combination thereof. The interfacial layer may comprise a basic metal, including Aluminum, Gallium, Indium, Tin, Thallium, Lead, Bismuth, or a combination thereof. The interfacial adhesion layer may comprise a semi-metal, including Boron, Silicon, Germanium, Arsenic, Antimony, Tellurium, Polonium, II-VI or III-V semiconductors, or a combination thereof. The interfacial adhesion layer may comprise an alkali metal, including lithium, sodium, potassium, rubidium, cesium, francium, or a combination thereof. The interfacial adhesion layer may comprise an alkali earth metal, including Beryllium, Magnesium, Calcium, Strontium, Barium, Radium, or a combination thereof. The interfacial adhesion layer may comprise a metal oxide, including but not limited to titanium oxide, vanadium oxide, copper oxide, indium tin oxide, or a combination thereof. The interfacial adhesion layer may comprise a metal sulfide, including but not limited to tungsten sulfide, ferric sulfide, molybdenum disulfide, silicon sulfide, or a combination thereof. The interfacial adhesion layer may comprise a metal selenide, including but not limited to gallium selenide, indium selenide, cadmium selenide, or a combination thereof. The interfacial adhesion layer may comprise a metal telluride, including but not limited to cadmium telluride, bismuth telluride, lead telluride, or a combination thereof.

The rigid electronic component may comprise an application-specific integrated circuits (ASIC), a system-on-chip (SOC), a central processing unit, a graphical processing unit, a microcontroller, a wireless transceiver, a field-programmable gate array (FPGA), a digital signal processor (DSP), an analog-to-digital converter (ADC), a display row or column driver for active matrix backplanes, an amplifier, a photosensor, a pressure sensor, a temperature sensor, a surface-mount resistor, capacitor, or inductor, and other non-compliant electronic components, or a combination thereof. The rigid electronic component may be attached to the interfacial adhesion layer via isotropically conductive adhesives, such as but not limited to silver-filled epoxy. The rigid electronic may be attached to the interfacial adhesion layer via anisotropically conductive adhesives, such as but not limited to nickel-plated polymer sphere epoxy composites. The rigid electronic component may be attached to the interfacial adhesion layer via non-conductive adhesives, such as but not limited to the use of patterned interconnect surfaces compressed and heated against the interfacial adhesion layer. The rigid electronic component may be attached to the interfacial adhesion layer via direct metal alloying, such as but not limited to the use of ultrasonic bonding, microwelding and annealing of interfacial layers. The rigid electronic component may be attached to the interfacial adhesion layer via solder reflow, such as but not limited to Sn solder reflow, $Sn_xCu_{(1-x)}$ solder reflow, $Sn_xAg_{(1-x)}$ solder reflow, $Sn_xSb_{(1-x)}$ solder reflow, $In_xSn_{(1-x)}$ solder reflow and $Bi_xSn_{(1-x)}$ solder reflow.

Once the flexible polymeric substrate film has been casted and cured, the material (an electronic-grade polysulfide film) allows for microfabrication atop the flexible polymeric substrate films which may undergo thermomechanical transitions during thermal cycling of photolithographic processing. In doing so, the flexible polymeric substrate film allows for thermal stress management caused by dissimilarities in thermal expansion, and permits the fabrication of circuitry atop these soft substrates. Additional benefits of the flexible polymeric substrate film are extremely smooth surfaces, easily-tunable optical properties such as transmission and birefringence, increased adhesion between thin-films deposited atop the substrate, and chemical compatibility with a host of acids, bases and solvents.

Several design principles are considered for successful device fabrication atop the flexible polymeric substrate films. For example, thermal stress management between the flexible polymeric substrate film and the thin-film structures atop the flexible polymeric substrate film are considered. In substrate materials, with static or minimally-changed thermomechanical properties (e.g., the Young's modulus, the Poisson ratio, the coefficient of thermal expansion, etc.), thermal stress accumulates during thermal cycling between the substrate and the thin-film structures at a known linear rate proportional to a difference in expansion of the two materials, the modulus of the constrained material, and the differential in temperature. However, if these material properties can change as a function of a transition temperature (e.g., a glass transition, a melt transition, etc.), then the thermal stress at the interface can be rationally decreased based on the choice of the temperature where these material properties are modulated. Another component of using materials that will manage interfacial stresses through the transition from a set of thermomechanical properties to another set of thermomechanical properties is maintenance of dimensional stability throughout the transition in a predictably reversible fashion. The organic substrate of choice may include chemical, physical, or supramolecular links between polymer chains. By varying the density, type, bond strength, and chemical composition of the links between the polymer chains, the thermal expansion and contraction of an area selection atop the substrate can be accurately modeled. Given that no degradation occurs within the links between polymer chains, the thermal expansion and contraction of the areal selection atop the substrate can be predicted to return to the initial spatial location of the areal selection before thermal cycling. After providing dimensional stability, the adhesion between the flexible polymeric substrate film and the thin-film structures built atop the flexible polymeric substrate film such as to prevent delamination of structures during thermal expansion, especially during transitions between sets of thermomechanical properties, is considered. While a majority of polymer substrates utilize only weak adhesion forces (e.g., electrostatic, van der Waals, London dispersion) between the substrate film and the thin film structures, the rational design and choice of a polymer backbone can lead to semi-covalent linkages between the organic substrate layer and the inorganic thin-films deposited atop the organic substrate layer. Coupled with the same weak adhesion forces described above, the combined adhesion mechanisms of such films increase critical forces used for a delamination event and allows for the usage of thermomechanical transitions for stress management. Additionally, utilizing materials that undergo a thermomechanical transition (e.g., glass transition, melt transition, etc.) at temperatures above designated usage temperatures, yet below the upper limit of temperatures seen during the microfabrication process, enables the usage of the thermomechanical transition as a method to conform the flexible polymeric substrate films with a device stack to a target three-dimensional surface. By elevating the temperature through the thermomechanical transition, material properties such as the Young's modulus can be lowered and used to deform the device stack to the desired geometry. Then, by lowering the temperature through the thermomechanical transition, the temporary deformation can be temporarily held due to an increase of the Young's modulus back to the original value. Furthermore, it may be desirable to consider internal film stress for polymers utilized as substrates for the microfabrication of thin-film transistors. By curing from a monomeric or oligomeric solution precursor and utilizing specific chemistries which undergo step-growth polymerizations, the delayed gelation of networks yields polymer substrates with drastically reduced internal cure stresses and allows for the formation of films with the previously described properties.

Figure 7:
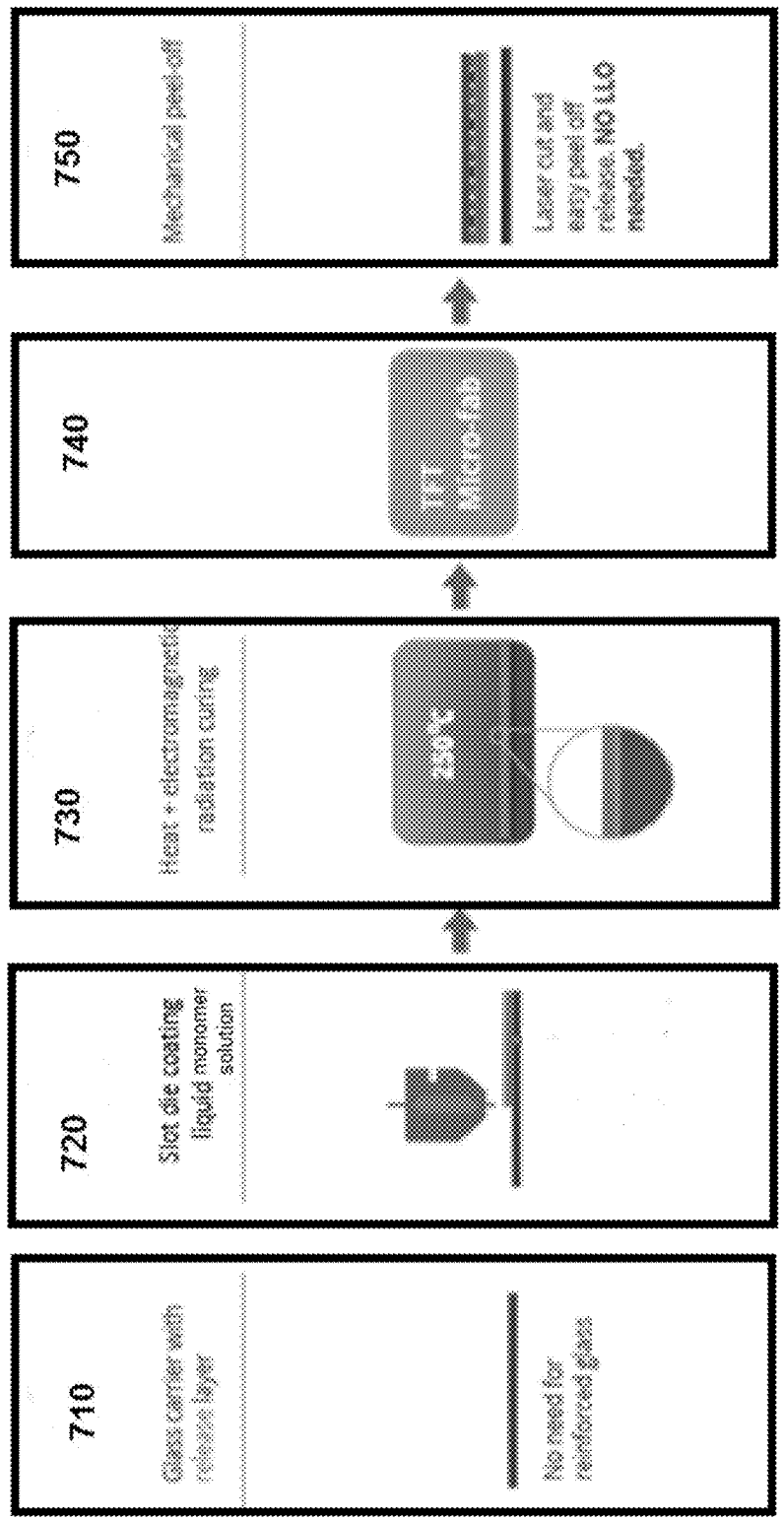
FIG. 7 is an illustration of a microfabrication process using the transparent flexible substrate of FIG. 1.

FIG. 7 is an illustration of a microfabrication process using the flexible polymeric substrate films discussed herein. Initially, at block 710, a release layer is deposited on a glass carrier (e.g., silicon dioxide). Subsequently, at block 720, a slot die coating system is used to apply the monomer solution to the glass carrier above the release layer. After applying the monomer solution, monomer solution is cured 730 to provide the flexible polymeric substrate film using heat and/or electromagnetic radiation. The flexible polymeric substrate film may generate a surface roughness of less than 0.5 nm. After curing, the flexible polymeric substrate film and the glass carrier are subjected to a TFT microfabrication process 740 to build the TFT devices on the flexible substrate. Subsequently, a mechanical peel-off process 750 is performed on the flexible polymeric substrate film to remove the flexible polymeric substrate film with the TFT devices. The mechanical peel-off process 750 may include a laser cut and an easy peel-off release. With this technique, a laser lift-off (LLO) process is not used.

EXAMPLES

Example 1

The following table illustrates some of the properties of an example flexible polymeric substrate film:

| Property | Measurement Range | Value | Units | Method |
|---|---|---|---|---|
| Physical | | | | |
| Ultimate Tensile Strength | 25° C. | 55 | MPa | ASTM D1708 |
| | 60° C. | 10 | | |
| | 100° C. | 3 | | |
| Ultimate Elongation | 25° C. | 5 | % | ASTM D1708 |
| | 60° C. | 135 | | |
| | 100° C. | 50 | | |
| Young's Modulus | 25° C. | 2 | GPa | ASTM D1708 |
| | 60° C. | 0.1 | | |
| | 100° C. | 0.03 | | |
| Thermal | | | | |
| Coefficient of Thermal Expansion (in-plane; linear) | 0-50° C. | 35 | ppm/° C. | TMA |
| | 50-250° C. | 150 | | |
| Surface Roughness | 100 $\mu m^2$ | <1 | nm | AFM |
| Glass Transition ($T_g$) | −40-200° C. | 53 | ° C. | DSC |
| Melting Point ($T_m$) | — | — | ° C. | — |
| Thermal Degradation - 1% ($T_{1\%}$) | 25-700° C. | 275 | ° C. | TGA |
| Thermal Degradation - 5% ($T_{5\%}$) | 25-700° C. | 360 | ° C. | TGA |
| Thermal Degradation - Onset ($T_d$) | 25-700° C. | 370 | ° C. | TGA |
| Optical | | | | |
| Optical Transmission | 230-375 nm | 0-80 (linear) | % | UV-Vis |
| | 365-450 nm | >80 | | |
| | 450-800 nm | >90 | | |
| Refractive Index | — | 1.555 | — | ASTM D542 |
| Retardation | 2000 $mm^2$ | 0.21 | nm | ASTM D4093 |
| Birefringence | 2000 $mm^2$ | 42 | nm/cm | ASTM D4093 |
| Haze | 2000 $mm^2$ | 0.46 | % | ASTM D1003 |
| Chemical Compatibility[a] | | | | |
| Polar Protic Solvent (e.g. water) | 23° C. | GOOD | — | Exp. |
| Polar Aprotic Solvent (e.g. acetone) | 23° C. | GOOD[b] | — | Exp. |
| Nonpolar Solvent (e.g. chloroform) | 23° C. | GOOD | — | Exp. |
| Weak/Strong Acid (e.g. 1.0M HCl) | 23° C. | EXCELLENT | — | Exp. |
| Weak Base (e.g. 3% TMAH) | 23° C. | EXCELLENT | — | Exp. |
| Strong Base (e.g. 1.0M KOH) | 80° C. | POOR | — | Exp. |

[a]no observable change in material properties and dimension for:
[a]no observable change in material properties and dimension for: EXCELLENT - >30 min GOOD - 10-30 min FAIR - 5-10 min POOR - <5 min
[b]will not damage material, but will swell significantly

Example 2

To a fluid reservoir was added the multifunctional thiol monomer trimethylolpropane tris(3-mercaptopropionate) (1 mol eq.) and the multifunctional co-monomer 1,3,5-Triallyl-1,3,5-triazine-2,4,6(1H,3H,5H)-trione (1 mol eq.), and the container was sealed. The sealed container was placed into a rotary mixer and mixed at 2350 rotations per minute (rpm) for 5 minutes. The container was removed from the mixer, opened, and 1.5 wt % of the free-radical initiator 2,2-dimethoxy-2-phenylacetophenone was added into the mixed monomer solution at room temperature (about 25° C.). The container was again sealed, placed into the rotary mixer and mixed at 2350 rpm for an additional 5 minutes. No organic solvent was added to the solution, resulting in the fluid reservoir containing a 100% (w/w) solid-fraction monomer solution. The monomer solution mixture was mounted to a slot-die coating tool and processed into a thin-film atop a carrier substrate via the slot-die coating technique. The cast monomer solution was introduced to an ultraviolet (UV) curing oven and exposed to 10 J/cm^2 of 365 nm light to initiate the polymerization, giving the flexible polymeric substrate film. After the polymerization, the flexible polymeric substrate film (either on the carrier substrate or separated therefrom) was ready for photolithographic processing.

After slot die coating the film on 6-inch Si carrier wafers, and then processed in a standard IGZO manufacturing flow.

Figure 8:
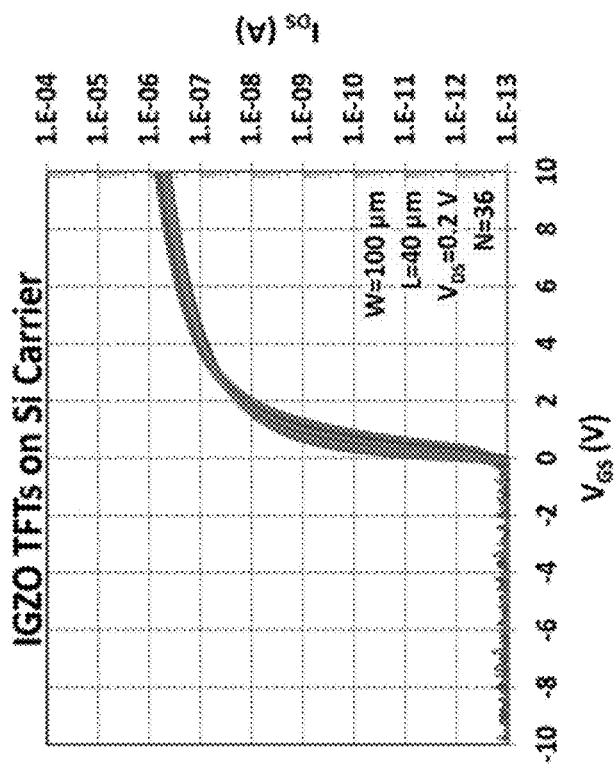
FIG. 8 is an illustration of two chards depicting performance of thin-film transistors (TFTs) on the transparent flexible substrate of FIG. 1 and the performance of TFTs on a silicon carrier.
Figure 8:
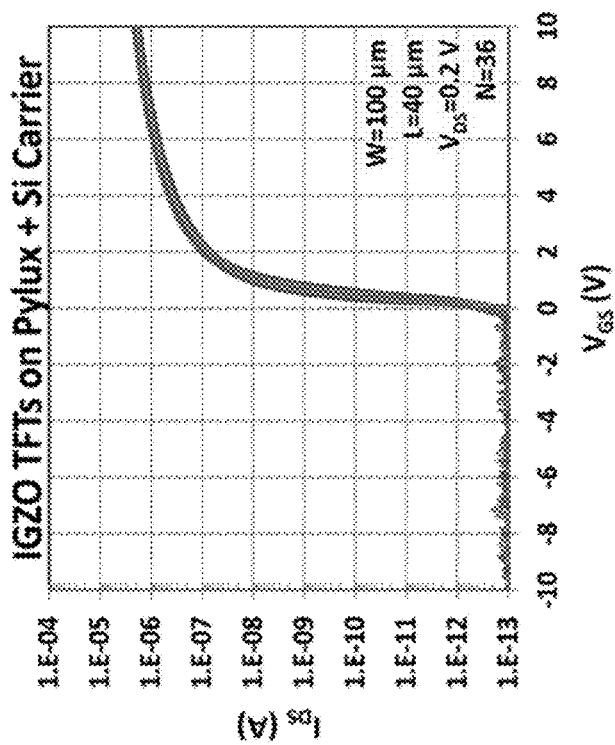

The TFT devices were fabricated using a stepper aligner, with features as small as 5 μm, in a staggered bottom-gate TFT configuration. Given the low surface roughness intrinsic of the flexible polymeric substrate film, no planarization layer was required. During the fabrication process, the flexible polymeric substrate film was exposed to 250° C. temperatures and sustained contact with different wet chemistries, including photoresist, acids, bases, and solvents. Companion bare Si wafers were also processed to compare the performance of TFTs fabricated with and without the flexible substrate film. The electrical performance of the fabricated TFTs was characterized by measuring drainsource current (IDS), with forward and reverse sweeps of the gate-source voltage (VGS) between −10 V and 10 V, a drain-source voltage (VDS) equal to 0.2V. The transfer curves were measured for 36 devices on wafers both with and without the flexible substrate, and are shown in FIG. 8.

TFT devices fabricated on the flexible substrate exhibit a performance in an expected range for a device that does not include the flexible polymeric substrate film. For example, extracted field-effect electron mobilities show values of 21 cm$^2$/Vs and 7 cm$^2$/Vs for TFTs fabricated on the flexible substrate and bare Si, respectively. Both of these values are in the expected range for IGZO devices, which is greater than a typical amorphous Si mobility of approximately 1 cm$^2$/Vs. The difference between the extracted field-effect electron mobilities shown with the flexible polymeric substrate film and without the flexible polymeric substrate film is attributable to process variations, and not to fundamental differences in the thin-film stacks. $I_{ON}/I_{OFF}$ ratios and $V_{ON}$ hysteresis values are also within an expected range. For example, the $I_{ON}/I_{OFF}$ ratios and $V_{ON}$ hysteresis values are above 1×10$^7$ and below 500 mV, respectively. Example 2 has demonstrated the fabrication of high-performance IGZO TFT devices on a flexible polymeric substrate film material. These devices were fabricated using a standard commercial IGZO TFT fabrication line, and show electron mobilities approximately 20× higher than that of 10 amorphous Si TFTs. Thus, the TFTs fabricated on the flexible polymeric substrate film are suitable for use in a high pixel density active-matrix organic light-emitting diode (AMOLED) display with high refresh rates. This may provide a foundation for the fabrication of truly flexible, large area displays.

Example 3

A flexible polymeric substrate film was fabricated using a monomer solution of multifunctional thiol monomer Tris[2-(3-mercaptopropionyloxy)ethyl] isocyanurate (1 mol eq.) and the multifunctional co-monomer Tris(4-hydroxyphenyl) methane triglycidyl ether (1 mol eq.). The monomer solution was placed in a sealed container. The sealed container was placed into a rotary mixer and mixed at 2350 rotations per minute (rpm) for 5 minutes. The container was removed from the mixer, opened, and 1.5 wt % of the catalyst tripropylamine was pipetted dropwise into the mixed monomer solution at room temperature (about 25° C.). The container was again sealed, placed into the rotary mixer and mixed at 2350 rpm for an additional 5 minutes. Finally, the container was again removed from the mixer, opened, and the organic solvent tetrahydrofuran was added until the final solution was a 92.5% (w/w) solute-fraction monomer solution. The monomer solution mixture was mounted to a slot-die coating tool and processed into a thin-film atop a carrier substrate via the slot-die coating technique. The cast monomer solution was introduced to a curing oven at 65° C. to initiate the polymerization, as well as evaporate the excess tetrahydrofuran, and baked for at least 1 hour, giving the final flexible polymeric substrate film. After the polymerization, the flexible polymeric substrate film (either on the carrier substrate or separated therefrom) was ready for photolithographic processing. No additional solvent removal steps were performed.

The invention claimed is:

1. A method of making a flexible polymeric substrate film comprising: providing a monomer solution comprising about 25 wt % to about 65 wt % of one or more thiol monomers and from about 25 wt % to about 65 wt % of one or more co-monomers; depositing the monomer solution on a carrier; curing the monomer solution to provide the flexible polymeric substrate film on the carrier; depositing an interfacial adhesion layer atop the flexible polymeric substrate film; and coupling a rigid inorganic electronic component to the flexible polymeric substrate film by attaching the rigid inorganic electronic component to the interfacial adhesion layer.

2. The method of claim 1, wherein the monomer solution comprises a solvent fraction less than 50% by weight.

3. The method according to claim 1, wherein the flexible polymeric substrate film is formed into its final shape using at least one of the following apparatuses: an oven; a slot die coater; a rod coater; a blade coater; a spin coater; or a reaction injection mold.

4. The method according to claim 1, wherein the monomer solution is off-stoichiometrically balanced with at least 5% excess mols of the thiol monomers.

5. The method according to claim 1, wherein the monomer solution is off-stoichiometrically balanced with at least 5% excess mols of the comonomers.

6. The method according to claim 1, wherein the flexible polymeric substrate film may be peeled off of the carrier.

7. The method according to claim 1, wherein the interfacial adhesion layer is deposited through electron beam evaporation, molecular beam epitaxy, reactive ion sputtering, pulsed laser deposition, atomic layer deposition, chemical vapor deposition, electroplating, or spin coating.

8. The method according to claim 1, wherein the interfacial adhesion layer comprises a metal selected from the group consisting of Lithium, Sodium, Potassium, Beryllium, Magnesium, Calcium, Titanium, Vanadium, Chromium, Manganese, Copper, Zinc, Yttrium, Zirconium, Niobium, Molybdenum, Ruthenium, Palladium, Silver, Iridium, Platinum, Gold, Mercury, Aluminum, Gallium, Indium, Tin, Thallium, Lead, Bismuth, and any combination thereof.

9. The method according to claim 1, wherein the interfacial adhesion layer comprises an element selected from the group consisting of Boron, Silicon, Germanium, Arsenic, Antimony, Tellurium, Polonium, and any combination thereof.

10. The method according to claim 1, wherein the interfacial adhesion layer comprises titanium oxide, vanadium oxide, copper oxide, indium tin oxide, tungsten sulfide, ferric sulfide, molybdenum disulfide, silicon sulfide, gallium selenide, indium selenide, cadmium selenide, cadmium telluride, bismuth telluride, lead telluride, or a combination thereof.

11. The method according to claim 1, wherein the rigid inorganic electronic component is selected from the group consisting of an application-specific integrated circuit (ASIC), a system-on-chip (SOC), a central processing unit, a graphical processing unit, a microcontroller, a wireless transceiver, a field-programmable gate array (FPGA), a digital signal processor (DSP), an analog-to-digital converter (ADC), a display row or column driver for active matrix backplanes, an amplifier, a photosensor, a pressure sensor, a temperature sensor, a surface-mount resistor, capacitor, inductor, or a combination thereof.

12. The method according to claim 1, wherein the rigid inorganic electronic component is attached to the interfacial adhesion layer using isotropically conductive adhesives, anisotropically conductive adhesives, non-conductive adhesives, or direct metal alloying.

13. The method according to claim 1, wherein the rigid inorganic electronic component is attached to the interfacial adhesion layer using Sn solder reflow, Sn, Cu (1–x) solder reflow, Sn Ag (1–x) solder reflow, Sn Sb (1–x) solder reflow, In Sn (1–x) solder reflow, Bi Sn (1–x) solder reflow, or a combination thereof.

* * * * *